(12) United States Patent
He et al.

(10) Patent No.: US 12,204,385 B2
(45) Date of Patent: Jan. 21, 2025

(54) METHOD AND APPARATUS FOR AN ION EMITTER-ASSISTED HEATPIPE

(71) Applicant: Dell Products, LP, Round Rock, TX (US)

(72) Inventors: Qinghong He, Austin, TX (US); Travis C. North, Cedar Park, TX (US); Nikhil Vichare, Austin, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 291 days.

(21) Appl. No.: 17/972,125

(22) Filed: Oct. 24, 2022

(65) Prior Publication Data

US 2024/0134426 A1 Apr. 25, 2024
US 2024/0231447 A9 Jul. 11, 2024

(51) Int. Cl.
*H01T 23/00* (2006.01)
*G06F 1/20* (2006.01)
*H05K 7/20* (2006.01)

(52) U.S. Cl.
CPC ............. *G06F 1/203* (2013.01); *H01T 23/00* (2013.01); *H05K 7/20309* (2013.01); *H05K 7/20318* (2013.01); *H05K 7/20336* (2013.01)

(58) Field of Classification Search
None
See application file for complete search history.

(56) References Cited

U.S. PATENT DOCUMENTS

| | | | |
|---|---|---|---|
| 8,467,168 B2 | 6/2013 | Honer | |
| 2009/0321056 A1* | 12/2009 | Ran | F28F 13/02 165/104.34 |
| 2011/0037367 A1 | 2/2011 | Wang | |
| 2011/0157813 A1 | 6/2011 | Macdonald | |
| 2011/0198978 A1 | 8/2011 | Sawyer | |
| 2011/0285267 A1 | 11/2011 | Lu | |
| 2012/0121487 A1 | 5/2012 | Jewell-Larsen | |
| 2015/0029658 A1* | 1/2015 | Yairi | H05K 7/20272 361/679.47 |
| 2017/0089611 A1 | 3/2017 | Yagoobi | |
| 2024/0126351 A1* | 4/2024 | He | G06F 1/203 |

FOREIGN PATENT DOCUMENTS

WO 2011/019806 A2 2/2011

* cited by examiner

*Primary Examiner* — Stephen W Jackson
(74) *Attorney, Agent, or Firm* — Prol Intellectual Property Law, PLLC; H. Kenneth Prol (57) ABSTRACT

An information handling system includes a processor, a memory device, and a PMU to provide power to the processor and memory device. The information handling system further includes an emitter-assisted heatpipe including an enclosed hollow chamber to house a working fluid capable of being vaporized upon application of heat at an evaporator end of the heatpipe, an ion emitter placed at the evaporator end of the heatpipe where the working fluid is vaporized upon application of heat to create a vapor within the enclosed hollow chamber of the heatpipe, the ion emitter to create ions within the vapor, an ion collector placed at a condenser end of the emitter-assisted heatpipe where the vapor condenses into a liquid, and an ionic driving circuit operatively coupled to the ion emitter, the generated ions to be attracted to the ion collector creating an ionic airflow of the vapor within the emitter-assisted heatpipe.

20 Claims, 4 Drawing Sheets

METHOD AND APPARATUS FOR AN ION EMITTER-ASSISTED HEATPIPE

FIELD OF THE DISCLOSURE

The present disclosure generally relates to cooling systems for information handling system. The present disclosure more specifically relates to an ion emitter used with a heatpipe used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may create a higher degree of noise that may interfere with the user of the information handling system especially when the fan speed is increased due to increased power consumption and a resulting increase in temperature within the housing.

The present specification describes a heatpipe used to transfer heat from heat-producing hardware within a housing of an information handling system from an evaporator and to a condenser end. The heatpipe includes, in an embodiment, an ion emitter and ion collector used to assist flow of vaporized fluids from a first evaporator end of the heatpipe to a second condenser end of the heatpipe. In an embodiment, the ion emitter creates ions within the vaporized fluid at a first evaporator end. The ion collector may impart an attractive force on the ions created by the ion emitter to create an ionic airflow via movement of ions shearing surrounding gas and vapor within the heatpipe. As the ions are repelled from the ion emitter and attracted to the ion collector disposed at a second condenser end, the movement of the vapor increases thereby transmitting heat from the first evaporator end (e.g., evaporator end) of the heatpipe to the second condenser end (e.g., condenser end) of the heatpipe.

In an embodiment, an information handling system includes a processor, a memory device, and a power management unit (PMU) to provide power to the processor and memory device. The information handling also includes a cooling system that includes a metal heatpipe. The metal heatpipe of the embodiments herein include an internal hollow, enclosed chamber to house a liquid capable of being vaporized upon application of heat, an ion emitter placed at a first evaporator end of the heatpipe where the liquid is vaporized upon application of heat to create a vapor within the hollow chamber of the heatpipe, the ion emitter to create ions within the vapor, and an ion collector placed at a second condenser end of the heatpipe where the vapor condenses into a liquid at the ion collector. The information handling system further includes an ionic driving circuit operatively coupled to the ion emitter and the ion collector to create an electric difference between the ion emitter and ion collector create an electric field between the ion emitter and ion collector for the created ions to be repelled from the ion emitter and attracted to the ion collector to create ionic airflow within the metal heatpipe.

In an embodiment, the ion emitter may be operatively coupled to a positive electrode of a high voltage source of the ionic driving circuit. The ion emitter may, during operation, strip electrons from molecules within the air and vapor creating positively-charged ions, in an example embodiment. Because these molecules are now positively charged, they are repelled away from the ion emitter and attracted to the ion collector that is operatively coupled to ground or to a negative electrode of the high voltage source of the ionic driving circuit. The operation of the ion emitter and ion collector improves the heat transferring capabilities of the heatpipe by assisting the flow of vapor in the heatpipe. The integrated ion emitter and ion collector also reduce the size of the heatpipe within the cooling system and the housing of the information handling system by providing greater heat conduction capacity in a smaller heatpipe to manage heat levels operated by the information handling system hardware components.

Figure 1:
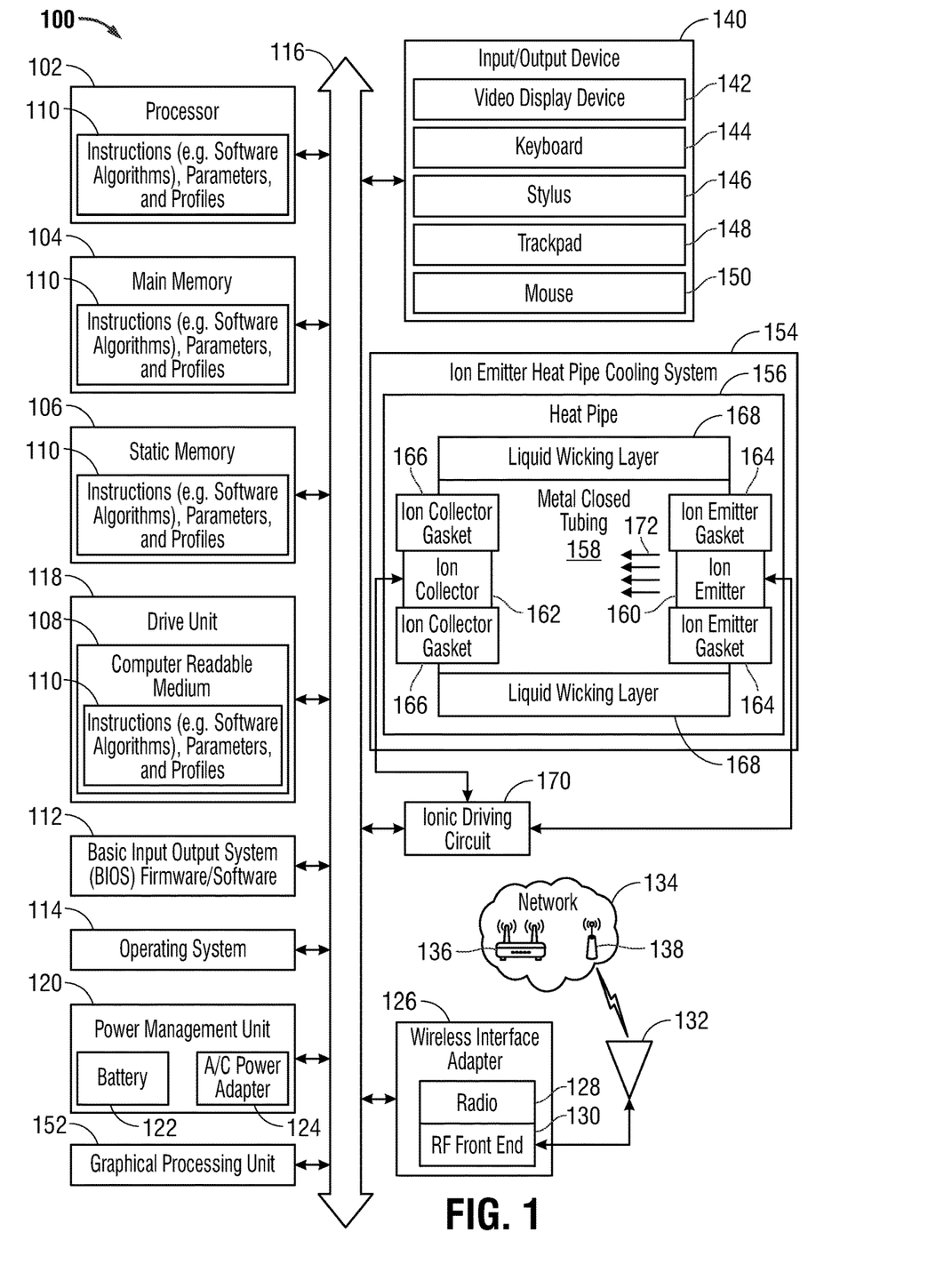
FIG. 1 is a block diagram of an information handling system including an ion emitter heatpipe cooling system with an emitter-assisted heatpipe according to an embodiment of the present disclosure.

FIG. 1 illustrates an information handling system 100 similar to information handling systems according to several aspects of the present disclosure that is operatively couplable to a cooling system formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or subsystems that individually or jointly execute a set, or multiple sets, of instructions to perform one or more computer functions.

The information handling system 100 may include memory (volatile (e.g., random-access memory, etc.), nonvolatile (read-only memory, flash memory etc.) or any combination thereof), one or more hardware processing resources, such as a central processing unit (CPU), a graphics processing unit (GPU) 152, hardware controllers, or any combination thereof. Additional components of the information handling system 100 can include one or more storage devices, one or more communications ports for communicating with external devices, as well as various input and output (110) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the devices or execute instructions for the one or more systems and modules described above, and operates to perform one or more of the methods described herein. The information handling system 100 may execute machine-readable code instructions 110 via processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a processor 102, a central processing unit (CPU), accelerated processing unit (APU), a neural processing unit (NPU), a vision processing unit (VPU), an embedded controller (EC), a digital signal processor (DSP), a GPU 152, a microcontroller, or any other type of hardware processing device that executes code instructions to perform the processes described herein. Any of the hardware processing resources may operate to execute code that is either firmware or software code. Moreover, the information handling system 100 can include memory such as main memory 104, static memory 106, computer readable medium 108 storing instructions 110 of, in an example embodiment, an ion emitter heatpipe cooling system 154 (e.g., controlled by a power management unit (PMU) controller), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz. Other Bluetooth® operating frequencies such as Bluetooth® operating frequencies such as 6 GHz are also contemplated in the presented description. In an embodiment, a Bluetooth® wireless link may be used to wirelessly couple the input/output devices operatively and wirelessly including the mouse 150, keyboard 144, stylus 146, trackpad 148, and/or video display device 142 to the bus 116 in order for these devices to operate wirelessly with the information handling system 100.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to an ion emitter heatpipe cooling system 154. The ion emitter heatpipe cooling system 154 may be coupled within a housing of the information handling system 100 in an embodiment so that heat generated by the operation of the hardware (e.g., processor 102, memory devices 104, 106, PMU 120, adapter 124 or battery 122, etc.) may be directed away from these devices via an ion emitter assisted heatpipe 156. This heat may, eventually, be directed out of the housing of the information handling system 100 via, in an embodiment, other active or passive cooling systems within the housing of the information handling system such as a heat sink, blower, fan, thermal fins, or the like.

The ion emitter heatpipe cooling system 154 includes an ion emitter assisted heatpipe 156. The heatpipe 156 includes a metal closed tubing 158 with a working fluid therein. In an embodiment, the metal closed tubing 158 may be made of a thermally conductive metal such as copper that can readily conduct and transmit heat through the metal. In an embodiment, example working fluids may include water ($H_2O$), carbon dioxide ($CO_2$), helium (He), hydrogen (H), methane ($CH_4$), neon (Ne), oxygen (O), acetone (($CH_3$)$_2$CO), ammonia ($NH_3$), nitrogen (N), cesium (Cs), potassium (K), sodium-potassium alloy (NaK), sodium (Na), and the like. In an embodiment, this working fluid may be placed under pressure within the metal closed tubing 158 of the heatpipe 156 in order to achieve a particular state (e.g., gas or liquid) of these fluids at a first evaporator end (e.g., an evaporator end) of the heatpipe 156 and at a second condenser end (e.g., a condenser end) of the heatpipe 156. These working fluids are used to receive heat at the first evaporator end of the heatpipe 156 which causes the working fluid to evaporate into a vapor. The evaporator end of the heatpipe may be thermally coupled to a heat producing hardware component such as a hardware processor 102, or other components according to embodiments herein. Where the working fluid is water, for example, the heat applied to the first evaporator end of the heatpipe 156 causes the water to turn into water vapor. At the second condenser end of the heatpipe 156, the working fluid is allowed to cool. Heat may then be transferred to various means such as a fan, a blower, and thermal fins, among other cooling devices causing the condenser end of the heatpipe 156 to be coiner so that the working fluid turns back into a liquid.

The heatpipe 156 further includes a liquid wicking layer 168 lining an interior surface of the heatpipe 156. The liquid wicking layer 168 may absorb the liquid working fluid at the second condenser end of the heatpipe 156 and transport the liquid from the second condenser end towards the first evaporator end of the heatpipe 156. The transportation of the liquid working fluid from the second condenser end to the first evaporator end of the heatpipe 156 by the liquid wicking layer 168 may be accomplished via a capillary action. In an embodiment, the liquid wicking layer 168 may include pores or other narrow spaces formed throughout the liquid wicking layer 168 that absorbs the liquid working fluid and, via capillary motion or action, passes the liquid from the second condenser end of the heatpipe 156 to the first evaporator end of the heatpipe 156. As the liquid working fluid gets closer to the first evaporator end of the heatpipe 156, the heat such as from a thermally coupled hardware device may again change the phase of the working fluid into a vapor starting the process over again.

In order to facilitate the movement of the vaporized working fluid from the first evaporator end of the heatpipe 156 to the second condenser end of the heatpipe 156, the ion emitter heatpipe cooling system 154 may include an ion emitter 160 placed at the first evaporator end of the heatpipe 156 and an ion collector 162 placed at the second condenser end of the heatpipe 156. Each of the ion emitter 160 and ion collector 162 may be formed into the ion emitter assisted heatpipe 156 such that the movement of the working fluid vapor within the heatpipe 156 enhanced from the first evaporator end to the second condenser end to increase the heat transfer load capacity of the heatpipe 156. In an embodiment, the ion emitter 160 may be operatively coupled to the heatpipe 156 via an ion emitter gasket 164 used to maintain the pressure and the working fluid within the heatpipe 156 at the first evaporator end. In an embodiment, the ion collector 162 may be operatively coupled to the heatpipe 156 via an ion collector gasket 166 used to maintain the pressure and the working fluid within the heatpipe 156 at the second condenser end. In another embodiment, the heatpipe 156 may include an ion collector gasket 166 but the ion emitter 160 is electrically coupled to the metal closed tubing 158 at the first evaporator end of the heatpipe 156 thereby using the metal closed tubing 158 as a surface from which ions can be generated as well.

The ion emitter 160 may include a surface from which ions may be created and repelled towards the second condenser end of the heatpipe 156 and the ion collector 162. In an embodiment where water is used as the working fluid, the ion emitter 160 may create positively-charged ions within the water vapor created by the vaporization of the water by the heat at the first evaporator end of the heatpipe 156. These positively-charged ions may include, in an example embodiment, $N_2^+$, $N_4^+$, $O_4^+$, $Ar^+$, $CO_2^+$, $H_2O^+$, $H^+$, $OH^+$, $H_3O^+$, $O^+$, $H_2^+$, and $O_2^+$ ions. These ions may be generated by the ion emitter 160 stripping electrons from outer valence shells of the molecules in the water vapor.

In an embodiment, the portions of the ion emitter 160 may be electroplated with a refractory metal such as niobium (Nb), chromium (Cr), molybdenum (Mo), tantalum (Ta), tungsten (W), and rhenium (Re) among others with an interior layer of the ion emitter 160 being made of a conductive material such as iron.

In an embodiment, the ion emitter 160 may be operatively coupled to a high voltage source (e.g., 2 kV to 10 kV voltage source difference between the ion emitter 160 and the ion collector 162) of the ionic driving circuit 170. In an embodiment, the ionic driving circuit 170 is controlled via the processor 102, the PMU 120 with a controller, or both. The ionic driving circuit 170, in an embodiment, includes a high voltage source that is operatively coupled to the ion emitter 160. In an embodiment, the high voltage source may include a boost converter that steps up voltage from its input (e.g., a battery 122 or A/C power adapter 124) to the output at the ion emitter 160 and/or ion collector 162. The high voltage source of the ionic driving circuit 170 causes the ion emitter 160 to emit ions 172 from the edges of the ion emitter 160. In the context of the present specification, the term "emit", or "emitter" is meant to describe an action and device that, at its edges or other surfaces, creates ions 172 and, via an electromagnetic repulsion, repels those ions towards an attracting, oppositely charged source such as the ion collector 162 described herein. As described herein, in an embodiment, the high voltage source of the ionic driving circuit 170 causes electrons to be ripped away from molecules in the water vapor thereby creating ions (e.g., positively charged ions) at the edges or other surfaces of the ion emitter 160. This ionization of the vaporized working fluids (e.g., water vapor) within the metal closed tubing 158 of the heatpipe 156 helps to cause an ionic flow within the metal closed tubing 158. In an embodiment, the movement of the ions from the ion emitter 160 to the ion collector 162 creates a shearing force on the other molecules (e.g., ionized molecules drag non-ionized molecules and ionized molecules) within the metal closed tubing 158. This shearing force pulls the other molecules in the direction that of the electric field created between the ion emitter 160 and ion collector 162 thereby creating this ionic airflow within the heatpipe 156 to enhance moving the vapor and increase heat load capacity of the heatpipe 156. In an example embodiment, the ion emitter 160 may be operatively coupled to a positive electrode of the high voltage source of the ionic driving circuit 170. As a result of generating the positively charged ions 172, the charged ion emitter 160 now repels those positively charged ions 172 causing the charged ions 172 to be repelled away from the ion emitter 160, following the electric field created between the ion emitter 160 and ion collector 162, and attracted to the ion collector 162.

In an embodiment, the ion collector 162 is operatively coupled to a negative or opposite electrode of the high voltage source of the ionic driving circuit 170. In an embodiment, the ion collector 162 is operatively coupled to a grounding source or high voltage negative source of the ionic driving circuit 170. Whether the ion collector 162 is coupled to a negative electrode of the high voltage source or to ground of the high voltage source, the voltage difference between the ion emitter 160 and ion collector 162 creates an electric field between the ion emitter 160 and the ion collector 162 and the ions created by the ion emitter 160 follow this electric field. During operation, the positively-charged ions created by the ion emitter 160 are repelled from the ion emitter 160, follows the electric field created between the ion emitter 160 and ion collector 162, and is attracted to the ion collector 162. When the positively-charged ions reach the ion collector 162 they are deionized. Because the ions form part of a vapor, as the vapor reaches the second condenser end of the heatpipe 156 where the ion collector 162 is located, the vapor condenses due to the colder surfaces at the second condenser end imparting heat to the colder surfaces. This condensation of the working fluid causes the working fluid to be absorbed by the liquid wicking layer 168 thereby allowing the working fluid to be transferred to the first evaporator end of the heatpipe 156 for the process to begin again with the working fluid being vaporized due to the increased heat at the first evaporator end due to thermally coupled hardware components.

In an embodiment, the heatpipe 156 may be operatively coupled to one or more thermal fins, fans, or other heat dissipating devices at the cooler, second condenser end. Where these passive cooling heat dissipating devices are thermally coupled to the second condenser end of the heatpipe 156, the heat is removed from that end of the heatpipe 156 and causing the condensation of the working fluid in the heatpipe 156 as described herein.

By including the ion emitter 160 and ion collector 162 within the metal closed tubing 158 of the ion emitter assisted heatpipe 156, the ion emitter heatpipe cooling system 154 may transfer heat away from heat-producing hardware within the housing of the information handling system 100 at a higher level or rate than a heatpipe without the enhanced vapor airflow generated by the ion emitter 160 and ion collector 162. Because the vapor of the working fluid is transported faster and more often from the first evaporator end of the ion emitter assisted heatpipe 156 to the second condenser end of the heatpipe 156 via the created ionic airflow, the rate of heat transfer is increased, and thus the heat load the ion emitter assisted heatpipe 156 can handle is increased. Still further, because heat can be conducted relatively quicker than conventional heatpipes via ionic airflow of the vapor using the ion emitter heatpipe cooling system 154 described herein, the size of the ion emitter assisted heatpipe 156 of embodiments herein may be reduced while still providing a heat load of a larger heatpipe without an emitter 160 and collector 162. This size reduction of the ion emitter heatpipe cooling system 154 may increase the space within the housing of the information handling system 100 for other hardware or reduce the size and weight of the information handling system 100 generally. In embodiments where the ion emitter heatpipe cooling system 154 described herein is further coupled to other heat conducting devices such as thermal fins, the amount of heat dissipated from the heat-producing devices is increased by the use of the ion emitter 160 and ion collector 162 within the heatpipe 156.

The information handling system 100 can include one or more set of computer-readable code instructions 110 that can be executed to cause the computer system to perform any one or more of the methods or computer-based functions disclosed herein. For example, computer-readable code instructions 110 may execute various software applications, software agents, a basic input/output system (BIOS) 112 firmware and/or software, or other aspects or components. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of computer-readable code instructions 110 such as software can be embedded to be executed by the processor 102 or other hardware processing devices such as a GPU 152 to perform the processes described herein. Similarly, main memory 104 and static memory 106 may also contain a computer-readable medium for storage of one or more sets of computer-readable code instructions, parameters, or profiles 110 described herein. The disk drive unit 118 or static memory 106 also contain space for data storage. Further, the computer-readable code instructions 110 may embody one or more of the methods as described herein. In a particular embodiment, the computer-readable code instructions, parameters, and profiles 110 may reside completely, or at least partially, within the main memory 104, the static memory 106, and/or within the disk drive 118 during execution by the processor 102 or GPU 152 of information handling system 100. The main memory 104, GPU 152, and the processor 102 also may include or access computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a controller and executable code instructions to manage the power provided to the components of the information handling system 100 such as the processor 102, and manage control of the ion emitter heatpipe cooling system 154 that includes the ion emitter 160, ion collector 162, and ionic driving circuit 166. The PMU 120 may control power to one or more components including the ionic driving circuit 170, one or more drive units 118, the processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels and be electrically coupled, either wired or wirelessly, to the information handling system 100 to provide this power and coupled to bus 116 to provide or receive data or instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module can execute software, firmware embedded at a device, hardware processing resource such as an Intel® Core class processor, ARM® brand processors, Qualcomm Snapdragon processors, or other hardware processors and chipsets, or other such device, operating a relevant environment of the information handling system. The system, device, controller, or module can also include a combination of the foregoing examples of hardware or hardware executing software. Note that an information handling system can include an integrated circuit or a board-level product having portions thereof that can also be any combination of hardware components and hardware executing software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
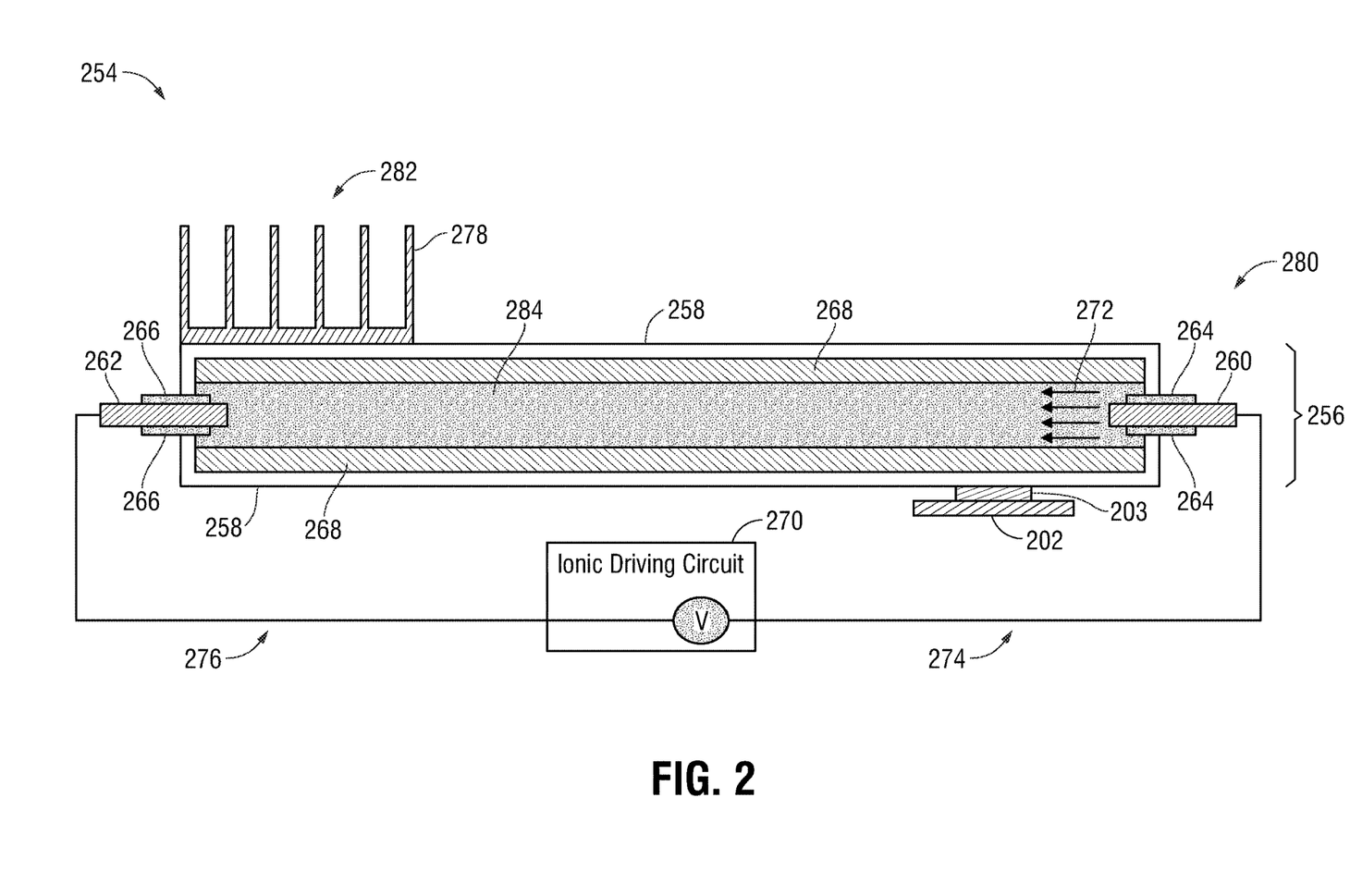
FIG. 2 is a graphic diagram cross-sectional view of an ion emitter heatpipe cooling system with an emitter assisted heatpipe for an information handling system according to an embodiment of the present disclosure.

FIG. 2 is a graphic diagram cross-sectional view of an ion emitter heatpipe cooling system 254 of an information handling system according to an embodiment of the present disclosure. The ion emitter heatpipe cooling system 254 may be installed with a first evaporator end 280 operatively coupled to a hardware processor 202 or other heat producing hardware component and a heat sink 203. The hardware processor 202 may be any type of processing device (e.g., a GPU, a CPU, a VPU, an EC, a DSP, an NPU, and the like) that generates heat during operation. It is appreciated that the first evaporator end 280 of the heatpipe 256 may be operatively coupled to another heat-generating device and the description of a processor 202 being used is merely an example embodiment of the operation of the ion emitter heatpipe cooling system 254 described herein. The heat sink 203 may be any type of device that absorbs the heat generated by the hardware processor 202 or other heat producing hardware component and dumps it into the first evaporator end 280 of the metal closed tubing 258 of the ion emitter assisted heatpipe 256. In an embodiment, the heat sink 203 includes a metal (e.g., copper) block that can absorb and transmit this heat from the hardware processor 202.

In the embodiment shown in FIG. 2, the ion emitter heatpipe cooling system 254 includes a heatpipe 256 that forms the emitter-assisted heatpipe of FIG. 2 according to embodiments herein. The heatpipe 256 includes a metal closed tubing 258 with a working fluid 284 therein. In an embodiment, the metal closed tubing 258 may be made of a thermally conductive metal such as copper that can readily conduct and transmit heat from the processor 202, through the metal to the first evaporator end 280 as well as towards the second condenser end 282 of the metal closed tubing 258. In an embodiment, example working fluids 284 may include water ($H_2O$), carbon dioxide ($CO_2$), helium (He), hydrogen (H), methane ($CH_4$), neon (Ne), oxygen (O), acetone (($CH_3$)$_2$CO), ammonia ($NH_3$), nitrogen (N), cesium (Cs), potassium (K), sodium-potassium alloy (NaK), sodium (Na), and the like. In an embodiment, this working fluid 284 may be placed under pressure within the metal closed tubing 258 of the heatpipe 256 in order to achieve a particular state (e.g., gas or liquid) of these fluids at a first evaporator end 280 (e.g., an evaporator end) of the heatpipe 256 and at a second condenser end 282 (e.g., a condenser end) of the heatpipe 256. These working fluids 284 are used to receive heat at the first evaporator end 280 of the heatpipe 256 which causes the working fluid 284 to evaporate into a vapor. Where the working fluid 284 is water, for example, the heat applied to the first evaporator end 280 of the heatpipe 256 causes the water to turn into water vapor. At the second condenser end 282 of the heatpipe 256, the working fluid 284 is allowed to cool. This second condenser end 282 is cooled via one or more passive or active cooling structures such as a fan, a blower, and thermal fins, among other cooling devices causing the working fluid 284 to turn back into a liquid state.

The heatpipe 256 further includes a liquid wicking layer 268 lining an interior surface of the heatpipe 256 metal closed tubing 258. The liquid wicking layer 268 may absorb the liquid working fluid 284 at the second condenser end 282 of the heatpipe 256 and transport the liquid towards the first evaporator end 280 of the heatpipe 256. The transportation of the liquid working fluid 284 from the second condenser end 282 to the first evaporator end 280 of the heatpipe 256 by the liquid wicking layer 268 may be accomplished via a capillary action. In an embodiment, the liquid wicking layer 268 may include pores or other narrow spaces formed throughout the liquid wicking layer 268 that absorbs the liquid working fluid 284 and, via capillary motion or action, passes the liquid from the second condenser end 282 of the heatpipe 256 to the first evaporator end 280 of the heatpipe 256. As the liquid working fluid 284 gets closer to the first evaporator end 280 of the heatpipe 256, the heat may again change the phase of the working fluid 284 into a vapor starting the process over again.

In order to facilitate the movement of the vaporized working fluid 284 from the first evaporator end 280 of the heatpipe 256 to the second condenser end 282 of the heatpipe 256, the ion emitter heatpipe cooling system 254 may include an ion emitter 260 placed at the first evaporator end 280 of the heatpipe 256 and an ion collector 262 placed at the second condenser end 282 of the heatpipe 256. Each of the ion emitter 260 and ion collector 262 may be formed into the heatpipe 256 such that the pressure and working fluid 284 within the heatpipe 256 is maintained and does not leak. In an embodiment, the ion emitter 260 may be operatively coupled to the heatpipe 256 via an ion emitter gasket 264 used to maintain the pressure and the working fluid 284 within the heatpipe 256. As shown in FIG. 2, the ion emitter gasket 264 forms a seal around the ion emitter 260 to seal the metal closed tubing 258 thereby preventing the working fluid 284 form escaping from the metal closed tubing 258 and maintaining a pressure within the metal closed tubing 258. The ion emitter gasket 264 may also, in an embodiment, electrically insulate the ion emitter 260 from the metal closed tubing 258 thereby isolating the ion emitter 260 as the source of generating the ions with high voltage as described herein.

In an embodiment, the ion collector 262 may be operatively coupled to the heatpipe 256 via an ion collector gasket 266 used to maintain the pressure and the working fluid 284 within the heatpipe 256. In an embodiment, the ion collector gasket 266 forms a seal around the ion collector 262 to seal the metal closed tubing 258 thereby preventing the working fluid 284 form escaping from within the metal closed tubing 258 and maintaining a pressure within the metal closed tubing 258. The ion collector gasket 266 may also, in an embodiment, electrically insulate the ion collector 262 and its high voltage from the metal closed tubing 258 thereby isolating the ion collector 262 from the metal closed tubing 258.

The ion emitter 260 may include a surface from which ions may be created and repelled towards the second condenser end 282 of the heatpipe 256 and the ion collector 262. In an embodiment where water is used as the working fluid 284, the ion emitter 260 may create positively-charged ions within the water vapor created by the vaporization of the water by the heat at the first evaporator end 280 of the heatpipe 256. These positively-charged ions may include, in an example embodiment, $H_2O+$, $H+$, $OH+$, $H_3O+$, $O+$, $H_2+$, and $O_2+$ ions. These ions may be generated by the ion emitter 260 stripping electrons from outer valence shells of the molecules in the water vapor.

In an embodiment, the portions of the ion emitter 260 may be electroplated with a refractory metal such as niobium (Nb), chromium (Cr), molybdenum (Mo), tantalum (Ta), tungsten (W), and rhenium (Re) among others with an interior layer of the ion emitter 260 being made of a conductive material such as iron. It is appreciated that the ion emitter 260 may be made of any alloy of metal that includes alloys of those refractory metals described herein.

In an embodiment, the ion emitter 260 may be operatively coupled to a high voltage source (e.g., 2 kV to 10 kV voltage source difference between the ion emitter 260 and the ion collector 262) of the ionic driving circuit 270. In some embodiments, the ionic driving circuit 270 is controlled via the hardware processor 202, a PMU with a hardware controller, some combination or other hardware processing resources. The ionic driving circuit 270, in an embodiment, includes a high voltage source that is operatively coupled to the ion emitter 260 via, for example, a positive electrode 274. In an embodiment, the high voltage source may include a boost converter that steps up voltage from its input (e.g., a battery or A/C power adapter) to the output at the ion emitter 260 and/or ion collector 262. The high voltage source of the ionic driving circuit 270 causes the ion emitter 260 to emit ions 272 from the edges of the ion emitter 260. In the context of the present specification, the term "emit", or "emitter" is meant to describe an action and device that, at its edges or other surfaces, creates ions 272 and, via an electromagnetic repulsion, repels those ions towards an attracting, oppositely charged source such as the ion collector 262 described herein. As described herein, in an embodiment, the high voltage source of the ionic driving circuit 270 causes electrons to be ripped away from molecules in the water vapor or other vaporized working fluid thereby creating ions (e.g., positively charged ions) 272 at the edges or other surfaces of the ion emitter 260. This ionization of the vaporized working fluids 284 (e.g., water vapor) within the metal closed tubing 258 of the heatpipe 256 helps to cause an ionic flow within the metal closed tubing 258 along an electric field. In an embodiment, the movement of the ions 272 from the ion emitter 260 to the ion collector 262 creates a shearing force on the other molecules (e.g., ionized molecules drag non-ionized molecules and ionized molecules) within the metal closed tubing 258. This shearing force pulls the other molecules in the direction of the electric field created between the ion emitter 260 and ion collector 262 thereby creating this ionic airflow within the closed metal tubing 258 to facilitate flow of vaporized working fluid 284. In an example embodiment, the ion emitter 260 may be operatively coupled to a positive electrode of the high voltage source of the ionic driving circuit 270. As a result of generating the positively charged ions 272, the charged ion emitter 260 now repels those positively charged ions 272 causing the charged ions 272 to be repelled away from the ion emitter 260, following the electric field created between the ion emitter 260 and ion collector 262, and attracted to the ion collector 262.

In an embodiment, the ion collector 262 is operatively coupled to a negative electrode 276 of the high voltage source of the ionic driving circuit 270. In an embodiment, the ion collector 262 is operatively coupled to a grounding source or high voltage negative source of the ionic driving circuit 270. Whether the ion collector 262 is coupled to a negative electrode of the high voltage source or to ground of the high voltage source, the voltage difference between the ion emitter 260 and ion collector 262 creates an electric field between the ion emitter 260 and the ion collector 262 and the ions 272 created by the ion emitter 260 follow this electric field. During operation, the positively-charged ions 272 created by the ion emitter 260 are repelled from the ion emitter 260, follows the electric field created between the ion emitter 260 and ion collector 262, and is attracted to the ion collector 262. When the positively-charged ions 272 reach the ion collector 262 they are deionized. Because the ions 272 form part of a vapor, as the vapor reaches the second condenser end 282 of the heatpipe 256 where the ion collector 262 is located, the vapor condenses due to the colder surfaces at the second condenser end 282. This condensation of the working fluid 284 causes the working fluid 284 to be absorbed by the liquid wicking layer 268 thereby allowing the working fluid 284 to be transferred to the first evaporator end 280 of the heatpipe 256 for the process to begin again with the working fluid 284 being vaporized due to the increased heat from the thermally coupled heat-generating hardware device such as hardware processor 202.

In an embodiment, the heatpipe 256 may be operatively coupled to one or more thermal fins 278, fans, or other heat dissipating devices. Where these heat dissipating devices are operatively coupled to the second condenser end 282 of the heatpipe 256, the heat is removed from that end of the heatpipe 256. This cooler second condenser end 282 causes the condensation of the working fluid 284 in the heatpipe 256 as described herein. In FIG. 2, thermal fins 278 are shown operatively coupled to the second condenser end 282 of the metal closed tubing 258 of the heatpipe 256. The thermal fins 278 may conduct heat away from the second condenser end 282 of the metal closed tubing 258 and dissipate it out of, in an example embodiment, a housing of the information handling system.

By including the ion emitter 260 and ion collector 262 within the metal closed tubing 258 of the heatpipe 256, the ion emitter heatpipe cooling system 254 may facilitate improved transfer heat away from heat-producing hardware such as hardware processor 202 within the housing of the information handling system. Because the vapor of the working fluid 284 is transported faster and more often from the first evaporator end 280 of the heatpipe 256 to the second condenser end 282 of the heatpipe 256 via the created ionic airflow of the working fluid vapor 284, the rate of heat transfer is increased. As a result, the heat transfer capacity of the ion emitter heat pipe cooling system 254 with the emitter-assisted heatpipe 256 is increased relative to a passive heat pipe without an ion emitter 260 and an ion collector 262. Still further, because he can be conducted relatively more quickly than conventional heatpipes using the ion emitter heatpipe cooling system 254 described herein, the size of the heatpipe 256 used may be reduced while still having the same heat transfer capacity of a larger passive heatpipe. This size reduction of the ion emitter heatpipe cooling system 254 may increase the space within the housing of the information handling system for other hardware or reduce the size and weight of the information handling system generally. In embodiments where the ion emitter heatpipe cooling system 254 described herein is further coupled to other heat conducting devices such as thermal fins, the amount of heat dissipated from the heat-producing devices is increased by the use of the ion emitter 260 and ion collector 262 within the heatpipe 256 having the ion emitter heat pipe cooling system 354.

Figure 3:
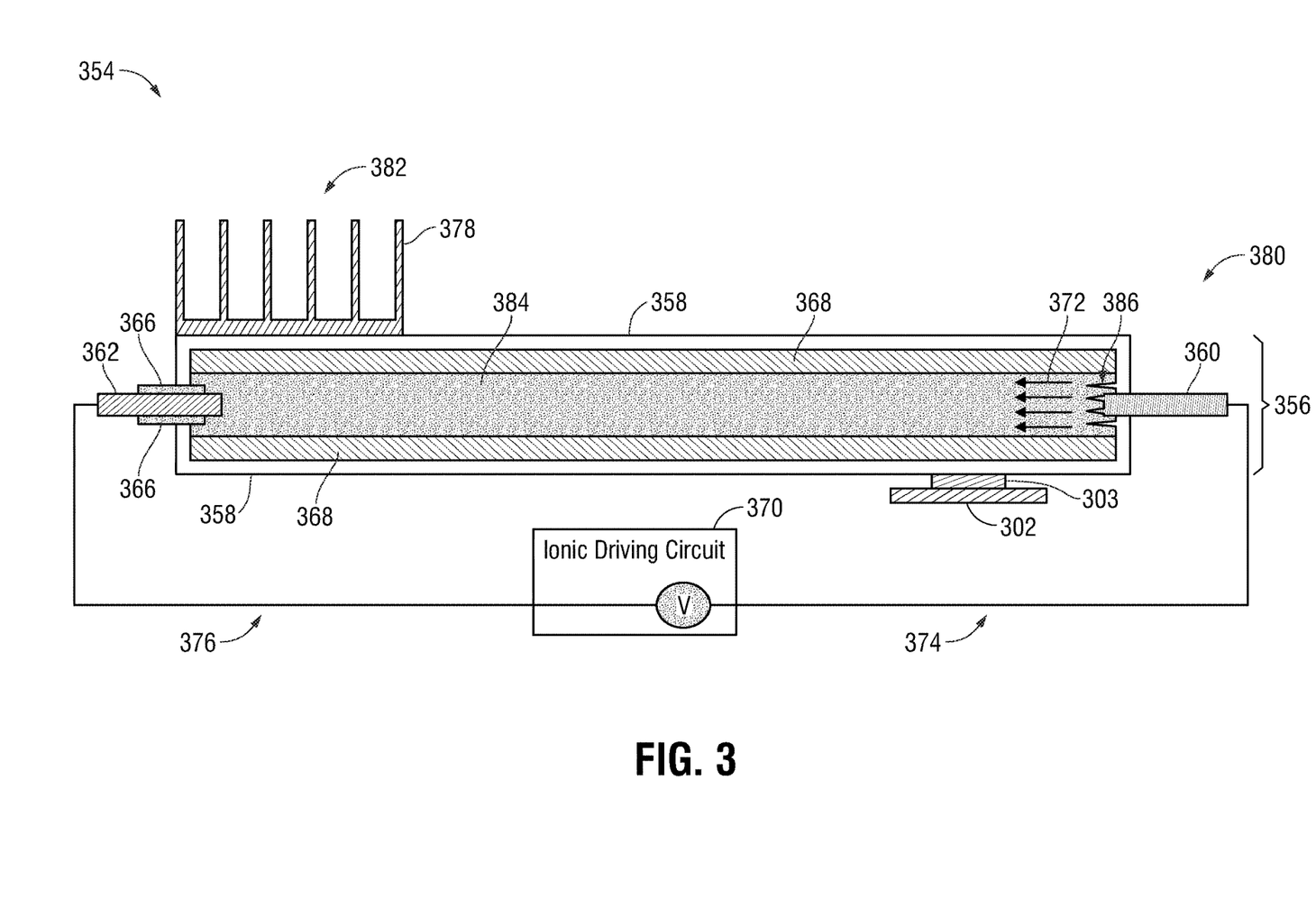
FIG. 3 is a graphic diagram cross-sectional view of an ion emitter heatpipe cooling system with an emitter assisted heatpipe for an information handling system according to another embodiment of the present disclosure.

FIG. 3 is a graphic diagram cross-sectional view of an ion emitter heatpipe cooling system 354 with an emitter-assisted heatpipe according to another embodiment of the present disclosure. The ion emitter heatpipe cooling system 354 may be installed with a first evaporator end 380 operatively or thermally coupled to a hardware processor 302 or other heat generating hardware component of an information handling system and a heat sink 303. The processor 302 may be any type of processing device (e.g., a GPU, a CPU, a VPU, an EC, a DSP, an NPU, and the like) that generates heat during operation in an example embodiment. It is appreciated that the first evaporator end 380 of the heatpipe 356 may be operatively coupled to another heat-generating hardware component device of an information handling system and the description of a processor 302 being used is merely an example embodiment of the operation of the ion emitter heatpipe cooling system 354 described herein. The heat sink 303 may be any type of device that absorbs the heat generated by the processor 302 and dumps it into the first evaporator end 380 of the metal closed tubing 358 of the heatpipe 356. In an embodiment, the heat sink 303 includes a metal (e.g., copper) block that can absorb and transmit this heat from the hardware processor 302 or another heat producing hardware component of an information handling system.

In the embodiment shown in FIG. 3, the ion emitter heatpipe cooling system 354 includes a heatpipe 356 that forms the emitter-assisted heat pipe of FIG. 3 according to embodiments herein. The heatpipe 356 includes a metal closed tubing 358 with a working fluid 384 therein. In an embodiment, the metal closed tubing 358 may be made of a thermally conductive metal such as copper that can readily conduct and transmit heat from the hardware processor 302, through the metal at the first evaporator end 380 and towards the second condenser end 382 of the metal closed tubing 358. In an embodiment, example working fluids 384 may include water ($H_2O$), carbon dioxide ($CO_2$), helium (He), hydrogen (H), methane ($CH_4$), neon (Ne), oxygen (O), acetone (($CH_3)_2CO$), ammonia ($NH_3$), nitrogen (N), cesium (Cs), potassium (K), sodium-potassium alloy (NaK), sodium (Na), and the like. In an embodiment, this working fluid 384 may be placed under pressure within the metal closed tubing 358 of the heatpipe 356 in order to achieve a particular state (e.g., gas or liquid) of these fluids at a first evaporator end 380 (e.g., an evaporator end) of the heatpipe 356 and at a second condenser end 382 (e.g., a condenser end) of the heatpipe 356. These working fluids 384 are used to receive heat at the first evaporator end 380 of the heatpipe 356 which causes the working fluid 384 to evaporate into a vapor. Where the working fluid 384 is water, for example, the heat applied to the first evaporator end 380 of the heatpipe 356 causes the water to turn into water vapor. At the second condenser end 382 of the heatpipe 356, the working fluid 384 is allowed to cool. The second condenser end 382 may be cooled by passive or active cooling systems such as a fan, a blower, and thermal fins, among other cooling devices causing the working fluid 384 to turn back into a liquid state.

The heatpipe 356 further includes a liquid wicking layer 368 lining an interior surface of the closed metal tubing 358 of the heatpipe 356. The liquid wicking layer 368 may absorb the liquid working fluid 384 at the second condenser end 382 of the heatpipe 356 and transport the liquid towards the first evaporator end 380 of the heatpipe 356. The transportation of the liquid working fluid 384 from the second condenser end 382 to the first evaporator end 380 of the heatpipe 356 by the liquid wicking layer 368 may be accomplished via a capillary action. In an embodiment, the liquid wicking layer 368 may include pores or other narrow spaces formed throughout the liquid wicking layer 368 that absorbs the liquid working fluid 384 and, via capillary motion or action, passes the liquid from the second condenser end 382 of the heatpipe 356 to the first evaporator end 380 of the heatpipe 356. As the liquid working fluid 384 gets closer to the first evaporator end 380 of the heatpipe 356, the heat may again change the phase of the working fluid 384 into a vapor starting the process over again.

In order to facilitate the movement of the vaporized working fluid 384 from the first evaporator end 380 of the heatpipe 356 to the second condenser end 382 of the heatpipe 356, the ion emitter heatpipe cooling system 354 may include an ion emitter 360 placed at the first evaporator end 380 of the heatpipe 356 and an ion collector 362 placed at the second condenser end 382 of the heatpipe 356. Each of the ion emitter 360 and ion collector 362 may be formed into the heatpipe 356 such that the pressure and working fluid 384 within the heatpipe 356 is maintained and does not leak. In the embodiment shown in FIG. 3, the ion emitter gasket (e.g., 264, FIG. 2) as shown in FIG. 2 is not included. Rather the ion emitter 360 is formed into the first evaporator end 380 the metal closed tubing 358 which is enclosed and prevents the working fluid 384 from exiting the metal closed tubing 358. By not including a gasket between the ion emitter 360 and the metal closed tubing 358, the first evaporator end 380 may be electrically coupled to the ion emitter 360 and the high voltage source of the ionic driving circuit 370. This causes the metal closed tubing 358 to form part of the ion emitter 360 and emit ions from the interior surface of the metal closed tubing 358. To further facilitate the ions 372 emitted from the first evaporator end 380 of the metal closed tubing 358, the metal closed tubing 358 and ion emitter 360 may include, in an embodiment, one or more emitting points 386 or edge surfaces. In an embodiment, these emitting points 386 may include any edge surfaces that are pointed, sharpened, flat, rounded, or edged. The generation of ions 372 by stripping away electrons from valence shells of molecules may be better facilitated at those points of the ion emitter 360 or, in this example embodiment, the interior surface of the metal closed tubing 358 that come to a point. As such, these points may be formed on the interior surface of the metal closed tubing 358 and on the ion emitter 360 so that ions 372 are formed at the first evaporator end 380 of the heatpipe 356 so that they may travel through to the second condenser end 382 of the heatpipe 356 thereby creating the ionic airflow of the working fluid vapor 384 as described herein.

In an embodiment, the ion collector 362 may be operatively coupled to the heatpipe 356 via an ion collector gasket 366 used to maintain the pressure and the working fluid 384 within the heatpipe 356. In an embodiment, the ion collector gasket 366 forms a seal around the ion collector 362 to seal the metal closed tubing 358 thereby preventing the working fluid 384 form escaping from within the metal closed tubing 358 and maintaining a pressure within the metal closed tubing 358. The ion collector gasket 366 may also, in an embodiment, electrically insulate the ion collector 362 from the metal closed tubing 358 thereby isolating the ion collector 362 from the metal closed tubing 358.

The ion emitter 360 may include a surface from which ions 372 may be created and repelled towards the second condenser end of the heatpipe 356 and the ion collector 362. In an embodiment where water is used as the working fluid 384, the ion emitter 360 may create positively-charged ions 372 within the water vapor created by the vaporization of the water by the heat at the first evaporator end of the heatpipe 356. These positively-charged ions 372 may include, in an example embodiment, $H_2O^+$, $H^+$, $OH^+$, $H_3O^+$, $O^+$, $H_2^+$, and $O_2^+$ ions 372. These ions 372 may be generated by the ion emitter 360 stripping electrons from outer valence shells of the molecules in the water vapor.

In an embodiment, the portions of the ion emitter 360 and any points 386 may be electroplated with a refractory metal such as niobium (Nb), chromium (Cr), molybdenum (Mo), tantalum (Ta), tungsten (W), and rhenium (Re) among others with an interior layer of the ion emitter 360 being made of a conductive material that is the same as the metal tubing 358 or another conductive material. It is appreciated that the ion emitter 360 and any points 386 or edge surfaces may be made of any alloy of metal that includes alloys of those refractory metals described herein.

In an embodiment, the ion emitter 360 may be operatively coupled to a high voltage source (e.g., 2 kV to 10 kV voltage source difference between the ion emitter 360 and the ion collector 362) of the ionic driving circuit 370. In an embodiment, the ionic driving circuit 370 is controlled via the processor 302, a PMU with a hardware controller, a combination thereof, or other hardware processing resources. The ionic driving circuit 370, in an embodiment, includes a high voltage source that is operatively coupled to the ion emitter 360 via, for example, a positive electrode 374. In an embodiment, the high voltage source may include a boost converter that steps up voltage from its input (e.g., a battery or A/C power adapter) to the output at the ion emitter 360 and/or ion collector 362. The high voltage source of the ionic driving circuit 370 causes the ion emitter 360 to emit ions 372 from the edges of the ion emitter 360. In the context of the present specification, the term "emit", or "emitter" is meant to describe an action and device that, at its edges or other surfaces, creates ions 372 and, via an electromagnetic repulsion, repels those ions 372 towards an attracting, oppositely charged source such as the ion collector 362 described herein. As described herein, in an embodiment, the high voltage source of the ionic driving circuit 370 causes electrons to be ripped away from molecules in the water vapor thereby creating ions 372 (e.g., positively charged ions 372) at the edges or other surfaces of the ion emitter 360. This ionization of the vaporized working fluids 384 (e.g., water vapor) within the metal closed tubing 358 of the heatpipe 356 helps to cause an ionic flow as well as vapor airflow within the metal closed tubing 358. In an embodiment, the movement of the ions 372 from the ion emitter 360 to the ion collector 362 creates a shearing force on the other molecules (e.g., ionized molecules drag non-ionized molecules and ionized molecules) within the metal closed tubing 358. This shearing force pulls the other molecules in the direction that of the electric field created between the ion emitter 360 and ion collector 362 thereby creating this ionic airflow of the working fluid vapor 384. In an example embodiment, the ion emitter 360 may be operatively coupled to a positive electrode of the high voltage source of the ionic driving circuit 370. As a result of generating the positively charged ions 372, the charged ion emitter 360 now repels those positively charged ions 372 causing the charged ions 372 to be repelled away from the ion emitter 360, following the electric field created between the ion emitter 360 and ion collector 362, and attracted to the ion collector 362.

In an embodiment, the ion collector 362 is operatively coupled to a negative electrode 376 of the high voltage source of the ionic driving circuit 370. In an embodiment, the ion collector 362 is operatively coupled to a grounding source or high voltage negative source of the ionic driving circuit 370. Whether the ion collector 362 is coupled to a negative electrode of the high voltage source or to ground of the high voltage source, the voltage difference between the ion emitter 360 and ion collector 362 creates an electric field between the ion emitter 360 and the ion collector 362 and the ions 372 created by the ion emitter 360 follow this electric field. During operation, the positively-charged ions 372 created by the ion emitter 360 are repelled from the ion emitter 360, follows the electric field created between the ion emitter 360 and ion collector 362, and is attracted to the ion collector 362. When the positively-charged ions 372 reach the ion collector 362 they are deionized. Because the ions 372 form part of a vapor of the working fluid 384, as the vapor reaches the second condenser end 382 of the heatpipe 356 where the ion collector 362 is located, the vapor condenses due to the colder surfaces at the second condenser end 382. This condensation of the working fluid 384 causes the working fluid 384 to be absorbed by the liquid wicking layer 368 thereby allowing the working fluid 384 to be transferred to the first evaporator end 380 of the heatpipe 356 for the process to begin again with the working fluid 384 being vaporized due to the increased heat.

In an embodiment, the heatpipe 356 may be operatively coupled to one or more thermal fins 378, fans, or other heat dissipating devices. Where these heat dissipating devices are coupled to the second condenser end 382 of the heatpipe 356, the heat is removed from that end 382 of the heatpipe 356 and causing the condensation of the working fluid 384 in the heatpipe 356 as described herein. In FIG. 3, thermal fins 378 are shown operatively coupled to the second condenser end 382 of the metal closed tubing 358 of the heatpipe 356. The thermal fins 378 may conduct heat away from the second condenser end 382 of the metal closed tubing 358 and dissipate it out of, in an example embodiment, a housing of the information handling system.

By including the ion emitter 360 and ion collector 362 within the metal closed tubing 358 of the heatpipe 356, the ion emitter heatpipe cooling system 354 may facilitate transfer heat away from heat-producing hardware such as hardware processor 302 within the housing of the information handling system. Because the vapor of the working fluid 384 is transported faster and more often from the first evaporator end 380 of the emitter-assisted heatpipe 356 to the second condenser end 382 of the heatpipe 356 via the created ionic airflow of the working fluid vapor 384, the rate of heat transfer is increased. As a result, heat transfer capacity of the ion emitter heat pipe cooling system 354 with the emitter-assisted heatpipe 356 is increased relative to a passive heat pipe. Still further, because he can be conducted relatively more quickly than conventional heatpipes using the ion emitter heatpipe cooling system 354 described herein, the size of the emitter-assisted heatpipe 356 used may be reduced while still maintaining the same heat transfer capacity. This size reduction of the ion emitter heatpipe cooling system 354 with the emitter-assisted heatpipe 356 may increase the space within the housing of the information handling system for other hardware or reduce the size and weight of the information handling system generally. In embodiments where the ion emitter heatpipe cooling system 354 described herein is further thermally coupled to other passive heat conducting devices such as thermal fins 378, the amount of heat dissipated from the heat-producing devices is increased by the use of the ion emitter 360 and ion collector 362 within the heatpipe 356 having the ion emitter heat pipe cooling system 354 having the ion emitter heatpipe cooling system 354.

Figure 4:
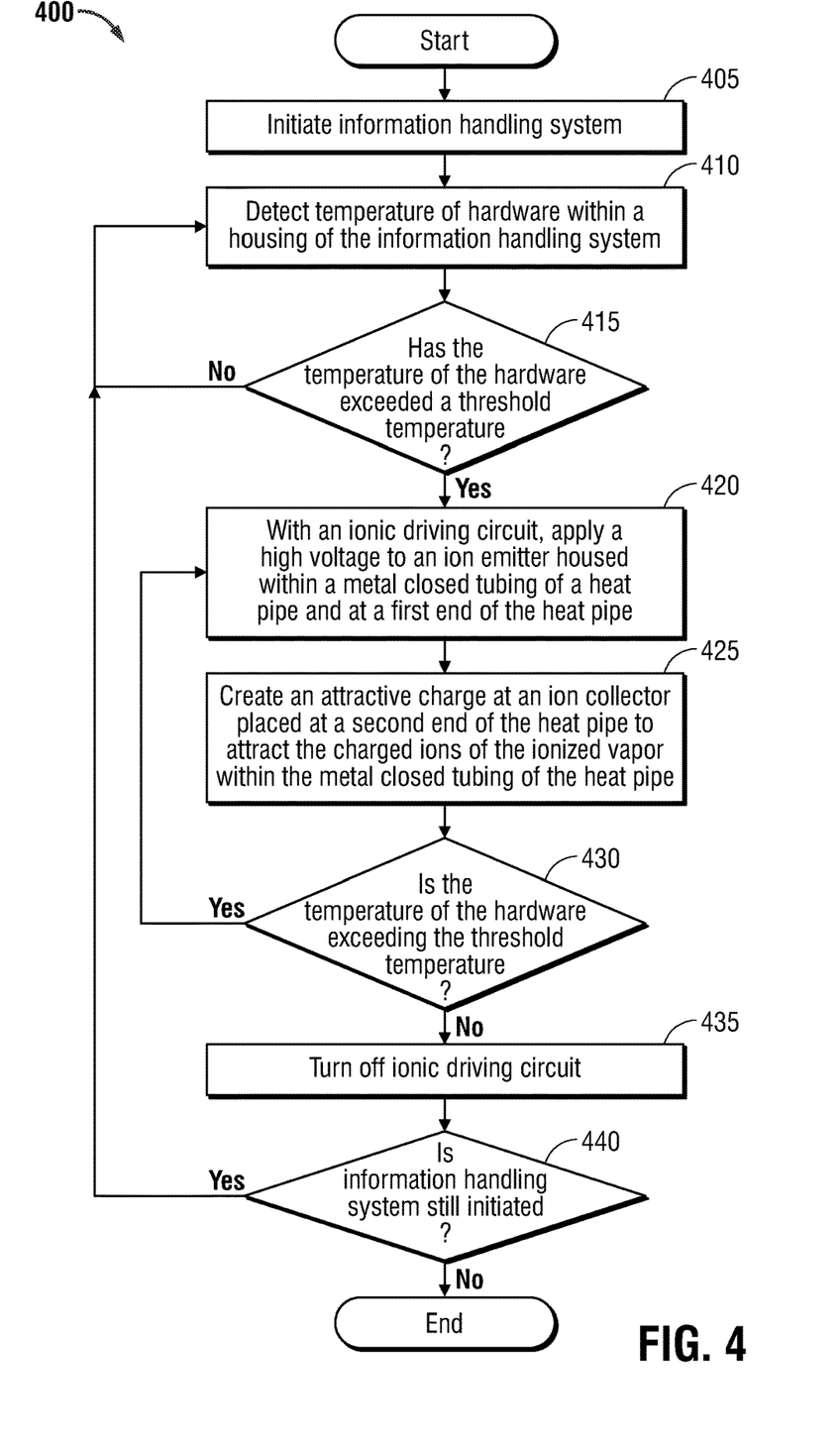
FIG. 4 is a flow diagram of a method of operating an ion emitter heatpipe cooling system with an emitter assisted heatpipe for an information handling system according to an embodiment of the present disclosure.

FIG. 4 is a flow diagram of a method 400 of operating an ion emitter heatpipe cooling system with an emitter assisted heatpipe of an information handling system according to an embodiment of the present disclosure. The method includes, at block 405 with initiating the information handling system. This initiation process may be conducted by the user actuating, for example, a power key on the information handling system. The actuation of this power key may cause the execution of a native BIOS, a native OS, or other code instructions used and executed by the processor of the information handling system to operate the hardware within the information handling system including the ion emitter fan cooling system described herein.

At block 410, the temperature of the hardware within the housing of the information handling system may be detected. In an embodiment, the temperature of the hardware that is detected may using a temperature sensor, such as a thermistor, disposed in the information handling system or coupled to one or more hardware devices such as the processor, PMU controller, or other hardware processing resource, battery, or video display device, for example, of the information handling system among other hardware devices. Other example embodiments may include a processing management system that measures the processing resources consumed by any type of hardware processing device or power levels consumed and calculates an interior temperature of the housing of the information handling system.

At block 415, it is determined whether the temperature of the hardware has exceeded a threshold temperature. In an embodiment, this threshold temperature may be selected based on an operating temperature of the hardware within the housing of the information handling system being monitored. In the context of FIGS. 2 and 3, for example, this hardware being monitored may include a hardware processor. In this example embodiment, an operating temperature of the hardware processor may serve as the threshold temperature.

Where the detected temperature of the hardware does not exceed the threshold temperature at block 415, the method 400 may return at block 410 with continuing to monitor the temperature of the hardware. Where the detected temperature of the hardware does exceed the threshold temperature, the method 400 continues to block 420. At block 420, the method 400 includes applying a high voltage to an ion emitter housed within a metal closed tubing of an ion emitter assisted heatpipe and at a first evaporator end of the heatpipe.

In an embodiment, it is appreciated that the operation of the heatpipe that forms the emitter-assisted heatpipe of embodiments herein, may also proceed without the operation of the ion emitter, ion collector, and ionic driving circuit as described herein. In this embodiment, the heatpipe may conduct heat away from the thermally coupled heat-generating hardware which causes the working fluid to vaporize at the first evaporator end of the heatpipe, pass the vaporized fluid towards the second condenser end, and condense due to the lower temperatures at the second condenser end. This process may be a passive process that is conducted when any amount of heat is conducted into the first evaporator end of the heatpipe. In one embodiment when, at block 415, the threshold temperature is detected that the ionic driving circuit is directed to pass a high voltage to the ion emitter and ion collector to drive ionic generation in a fluid within the metal closed tubing thereby creating the ionic airflow of vapor as described herein.

At block 420, the application of the high voltage to the ion emitter causes the ion emitter to generate or create ions. The ion emitter 160 may include a surface at the first evaporator end from which ions may be created and repelled towards the second condenser end of the heatpipe 156 and the ion collector 162. In an embodiment where water is used as the working fluid, the ion emitter 160 may create positively-charged ions within the water vapor created by the vaporization of the water by the heat at the first evaporator end of the heatpipe 156. These positively-charged ions may include, in an example embodiment, $H_2O^+$, $H^+$, $OH^+$, $H_3O^+$, $O^+$, $H_2^+$, and $O_2^+$ ions. These ions may be generated by the ion emitter 160 stripping electrons from outer valence shells of the molecules in the water vapor.

At block 425, the operative coupling of the ionic driving circuit to the ion collector also creates an attractive charge that attracts the charged ions of the ionized vapor within the metal closed tubing of the emitter-assisted heatpipe from the ion emitter to the ion collector at the second condenser end. In addition to the attractive force applied to the ions, the ionic airflow further pushes other fluid vapor molecules (either ionized or not) towards the ion collector thereby contributing to the ionic airflow. In this way, the ion emitter and ion collector generating the ionic airflow assist in movement of the vapor of the working fluid form the evaporator end to the condenser end of the emitter-assisted heatpipe of the embodiments herein.

The method 400 further includes, at block 430, with determining whether the temperature of the hardware still exceeds the threshold temperature. In order to save power provided either by a battery or by the A/C power adapter, the ion emitter heatpipe cooling system with an emitter assisted heatpipe may be selectively activated based on whether this threshold temperature has been reached or not. Where the temperature threshold is still met or is exceeded, the method 400 may return to block 420 with continuing to apply the high voltage to the ion emitter and ion collector for a voltage difference. Where the temperature threshold is not met or exceeded at block 430. The method 400 may continue to block 435 with turning off the ionic driving circuit. Again, turning off the ionic driving circuit does not turn off the passive cooling capabilities of the heatpipe to receive heat from the heat-generating device and conducting that heat away from those devices. This two-tiered cooling system allows the ionic driving circuit to be activated as the temperature exceeds a certain temperature (e.g., the threshold temperature) to enhance cooling capacity of the heat pipe and deactivated when the temperature is below that temperature while still allowing the heatpipe to cool the hardware.

The method 400 includes determining, at block 440, whether the information handling system is still initiated. Where the information handling system is no longer initiated (e.g., power has been removed from the information handling system via actuation of a power button), the method 400 may end here. Where the information handling system is still initiated, the method 400 may return to block 410 to continue to monitor the temperature of the hardware as described in embodiments herein.

The blocks of the flow diagrams of FIG. 4 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a processor;
   a memory device;
   a power management unit (PMU) to provide power to the processor and memory device;
   an emitter-assisted heatpipe comprising:
      an enclosed hollow chamber to house a working fluid capable of being vaporized upon application of heat at an evaporator end of the heatpipe;
      an ion emitter placed at the evaporator end of the heatpipe where the working fluid is vaporized upon application of heat to create a vapor within the enclosed hollow chamber of the emitter-assisted heatpipe, the ion emitter to generate ions within the vapor; and
      an ion collector placed at a condenser end of the emitter-assisted heatpipe where the vapor condenses into a liquid; and
   an ionic driving circuit operatively coupled to the ion emitter and the ion collector to apply voltage to create an electric field difference between the ion emitter and ion collector such that the generated ions to be repelled from the ion emitter and attracted to the ion collector to create an ionic airflow of the vapor within the emitter-assisted heatpipe from the evaporator end to the condenser end.

2. The information handling system of claim 1 further comprising:
   the ion emitter operatively coupled to a positive electrode of the ionic driving circuit to produce, at the ion emitter, positively-charged ions.

3. The information handling system of claim 1, further comprising:
   the ion collector operatively coupled to a negative electrode of the ionic driving circuit to deionize positively-charged ions created by the ion emitter.

4. The information handling system of claim 1 further comprising:
   an insulating gasket placed between the ion collector and the emitter-assisted heatpipe and between the ion emitter and the heatpipe to electrically isolate the ion collector and the ion emitter respectively from the emitter-assisted heatpipe.

5. The information handling system of claim 1 further comprising:
   the ion emitter being electrically coupled and integrated into the evaporator end to the emitter-assisted heatpipe to create an ionic airflow of the vapor between an interior surface at the evaporator end of the emitter-assisted heatpipe and the ion collector.

6. The information handling system of claim 5, further comprising:
edged surfaces formed onto the interior surface at the evaporator end of the emitter-assisted heatpipe, the edge surfaces creating ion emission locations of the ion emitter to generate the ions.

7. The information handling system of claim 1 further comprising:
a wick structure to transport, via capillary forces, a condensed liquid of the working fluid from the condenser end of the emitter-assisted heatpipe to the evaporator end of the emitter-assisted heatpipe.

8. The information handling system of claim 1, further comprising:
a heat sink and passive cooling structure formed at the condenser end of the emitter-assisted heatpipe to dissipate heat away from the emitter-assisted heatpipe to contribute to the condensation of the vapor into a condensed liquid of the working fluid.

9. An emitter-assisted heatpipe of a cooling system for an information handling system comprising:
an enclosed hollow chamber to house a working fluid capable of being vaporized upon application of heat;
an ion emitter placed at an evaporator end of the emitter-assisted heatpipe where the working fluid is vaporized upon application of heat to create a vapor within the enclosed hollow chamber of the emitter-assisted heatpipe, the ion emitter to generate ions within the vapor;
an ion collector placed at a condenser end of the emitter-assisted heatpipe where the vapor condenses into a liquid of the working fluid; and
an ionic driving circuit operatively coupled to the ion emitter and the ion collector to create an electric field difference between the ion emitter and ion collector via application of voltage at the ion emitter such that the generated ions are repelled from the ion emitter and attracted to the ion collector to create ion airflow of the vapor within the emitter-assisted heatpipe.

10. The emitter-assisted heatpipe of claim 9 further comprising:
the ion emitter operatively coupled to a positive electrode of the ionic driving circuit to apply a positive voltage to produce, at the ion emitter, positively-charged ions.

11. The emitter-assisted heatpipe of claim 9 further comprising:
the ion collector operatively coupled to a negative electrode of the ionic driving circuit to deionize positively-charged ions generated by the ion emitter.

12. The emitter-assisted heatpipe of claim 9 further comprising:
an insulating gasket placed between the ion collector and the emitter-assisted heatpipe and between the ion emitter and the emitter-assisted heatpipe to electrically isolate the ion collector and the ion emitter from the emitter-assisted heatpipe.

13. The emitter-assisted heatpipe of claim 9 further comprising:
the ion emitter integrated into the evaporator end of the emitter-assisted heatpipe to create an ionic airflow of the vapor between an interior surface of the emitter-assisted heatpipe at the evaporator end and the ion collector.

14. The emitter-assisted heatpipe of claim 13 further comprising:
edged surfaces formed onto the interior surface of the emitter-assisted heatpipe, the edge surfaces creating ion emission locations from which the ions are generated.

15. The emitter-assisted heatpipe of claim 9 further comprising:
a wick structure disposed in the enclosed hollow chamber to transport, via capillary forces, the condensed liquid of the working fluid from the condenser end of the emitter-assisted heatpipe to the evaporator end of the emitter-assisted heatpipe.

16. The emitter-assisted heatpipe of claim 9 wherein the evaporator end of the emitter-assisted heat pipe is thermally coupled to a heat producing hardware component of the information handling system.

17. A method of operating an ion emitter heatpipe system with an emitter-assisted heatpipe of an information handling system comprising:
detecting, with a temperature sensor, when a temperature threshold has been reached at the information handling system;
with an ionic driving circuit, applying a high voltage to an ion emitter when the temperature threshold is reached, the ion emitter being placed at an evaporator end of an emitter-assisted heatpipe where a working fluid is vaporized upon application of heat form a thermally-coupled heat generating hardware component to create a vapor within the emitter-assisted heatpipe, the ion emitter to generate ions within the vapor;
attracting the ions towards an ion collector operatively coupled to the ionic driving circuit, wherein the ion collector is placed at a condenser end of the emitter-assisted heatpipe where the vapor condenses into a liquid of the working fluid;
creating an ionic flow between the ion emitter and ion collector to generate an ionic airflow of the vapor of the working liquid between the evaporator end and the condenser of the emitter-assisted heat pipe; and
deionizing the ions created by the ion emitter at the ion collector.

18. The method of claim 17 further comprising:
the ion emitter operatively coupled to a positive electrode of the ionic driving circuit to produce, at the ion emitter, positively-charged ions.

19. The method of claim 17 further comprising:
an insulating gasket placed between the ion collector and the emitter-assisted heatpipe and between the ion emitter and the emitter-assisted heatpipe to electrically isolate the ion collector and the ion emitter respectively from the emitter-assisted heatpipe.

20. The method of claim 17 further comprising:
a wick structure in the emitter-assisted heatpipe to transport, via capillary forces, the condensed liquid of the working fluid from the condenser end of the emitter-assisted heatpipe to the evaporator end of the emitter-assisted heatpipe.

* * * * *